US010855276B1

(12) United States Patent
 Morrison

(10) Patent No.: US 10,855,276 B1
(45) Date of Patent: Dec. 1, 2020

(54) MECHANICAL ELECTROPERMANENT MAGNET KEY ASSEMBLY SWITCH WITH DUAL PURPOSE SPRING

(71) Applicant: Dell Products, LP, Round Rock, TX (US)

(72) Inventor: Jason S. Morrison, Chadron, NE (US)

(73) Assignee: Dell Products, LP, Round Rock, TX (US)

( * ) Notice: Subject to any disclaimer, the term of this patent is extended or adjusted under 35 U.S.C. 154(b) by 0 days.

(21) Appl. No.: 16/405,955

(22) Filed: May 7, 2019

(51) Int. Cl.
| | | |
|---|---|---|
| *H03K 17/972* | (2006.01) |
| *H01H 36/00* | (2006.01) |
| *H01F 1/057* | (2006.01) |
| *H01F 7/06* | (2006.01) |
| *H01F 7/02* | (2006.01) |
| *H03K 17/97* | (2006.01) |

(52) U.S. Cl.
 CPC ........... *H03K 17/972* (2013.01); *H01F 1/057* (2013.01); *H01F 7/0273* (2013.01); *H01F 7/064* (2013.01); *H01H 36/004* (2013.01); *H01H 36/00* (2013.01); *H01H 36/0006* (2013.01); *H01H 36/0026* (2013.01); *H03K 17/97* (2013.01)

(58) Field of Classification Search
 CPC ...... H03K 17/97; H03K 17/972; H01F 1/057; H01F 7/0273; H01F 7/064; H01H 36/00; H01H 36/0006; H01H 36/0026; H01H 36/0033; H01H 36/004; H01H 36/0093
 See application file for complete search history.

(56) References Cited

U.S. PATENT DOCUMENTS

| | | | | |
|---|---|---|---|---|
| 10,133,360 B2 * | 11/2018 | Morrison | ............... | G06F 3/0219 |
| 2018/0219553 A1 * | 8/2018 | Casparian | ............. | G06F 3/0219 |

* cited by examiner

*Primary Examiner* — Franklin D Balseca
(74) *Attorney, Agent, or Firm* — Prol Intellectual Property Law, PLLC; H. Kenneth Prol

(57) ABSTRACT

An electropermanent magnet key assembly of an information handling system comprising an electropermanent magnet (EPM) having a low-coercivity magnet and a high-coercivity magnet, wherein the EPM is capable of an on state generating a magnetic field and an off state disabling the magnetic field, a key cap, situated atop a pair of scissor plates, capable of downward movement, via action of the scissor plates, from a raised, neutral position in which a surface of the key cap is moved to a depressed position below the neutral position, wherein the downward movement of the key assembly may record a keystroke, a flange operably connected a first scissor plate of the pair of scissor plates and extending opposite of a hinge of the first scissor plate, such that the flange is attracted toward the magnetic field of the EPM situated beneath the pair of scissor plates to urge the first scissor plate to push the key cap to the neutral position in an on state, and a spring exerting a biasing force to rotate a rocker arm toward the flange for urging the flange away from the EPM opposite to the attraction of the magnetic field of the EPM, wherein the effect of the biasing force on movement of the flange is lesser than the effect of the magnetic field generated by the EPM on movement of the flange in the on state.

20 Claims, 6 Drawing Sheets

EXPLODED VIEW

US 10,855,276 B1

MECHANICAL ELECTROPERMANENT MAGNET KEY ASSEMBLY SWITCH WITH DUAL PURPOSE SPRING

FIELD OF THE DISCLOSURE

The present disclosure generally relates to a keyboard key switch assembly of information handling systems. The present disclosure more specifically relates to the use of electropermanent magnets in key switch assemblies.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling needs and requirements vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. The information handling system may include telecommunication, network communication, and video communication capabilities. Further, the information handling system may include a keyboard for manual input of information by the user.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

Figure 1:
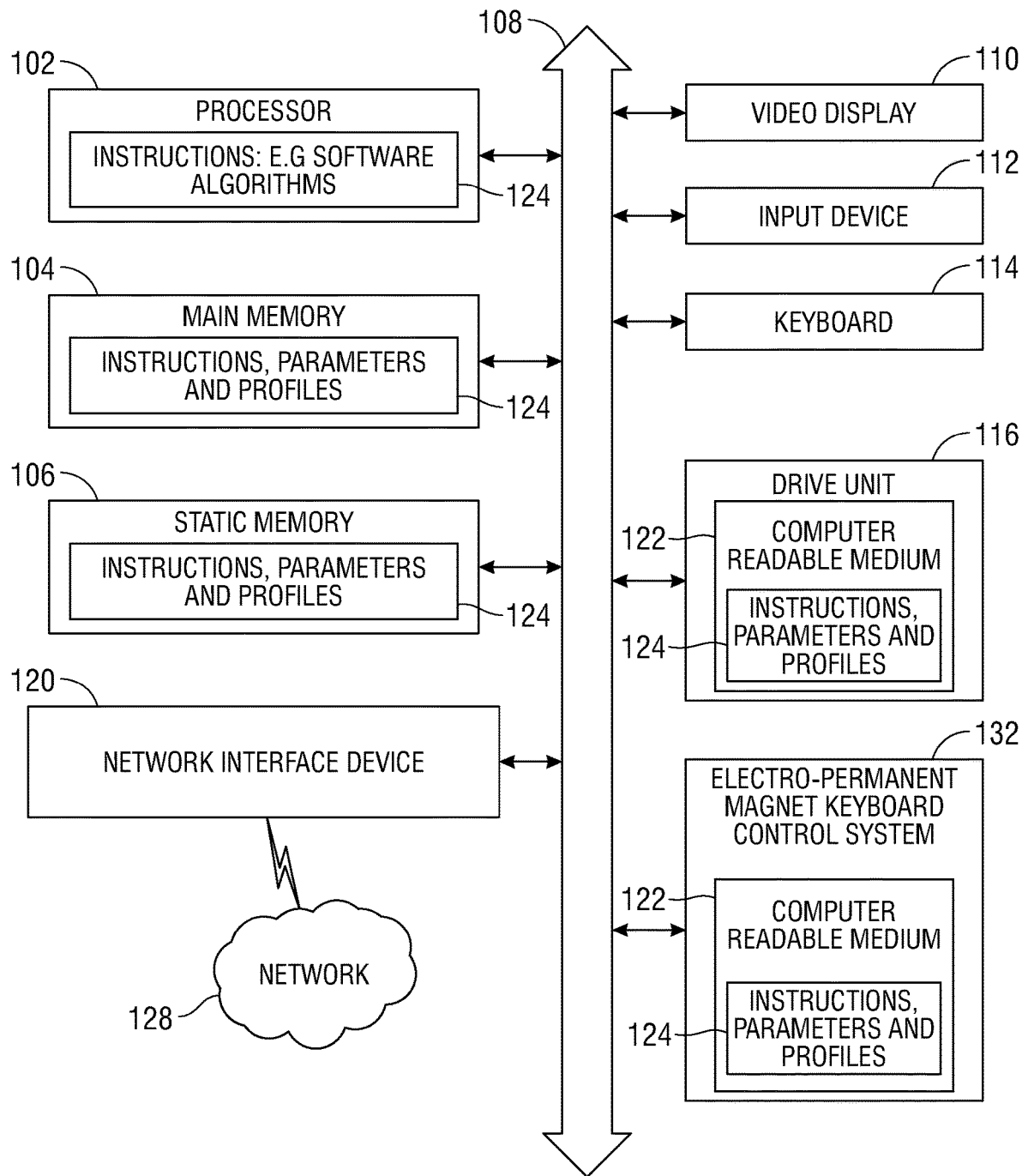
FIG. 1 is a block diagram illustrating an information handling system according to an embodiment of the present disclosure.

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

In existing systems, each key on the keyboard, when pressed by a user, depresses a rubber dome/cup, or similar device such that the bottom of the rubber dome device is pushed downward into contact with a sensor located underneath the rubber dome device. This contact between the sensor and the rubber dome device (or internal mechanism) causes the information handling system to register that the key has been pressed. As such, keys on existing keyboards have only one default position in which the key cap is flush with the other keys of the keyboard. A system is needed in which the keys of a keyboard may have multiple default positions, including a position in which the key cap is below the plane formed by the key caps of the surrounding keys.

Embodiments of the present disclosure address this issue by applying a magnetic force, rather than the force supplied by a deformed rubber dome structure to return each key to its default or neutral position, flush with the other keys. Such a magnetic force may be varied such that an individual key cap may have two positions, neutral and flush with other keys or recessed in some embodiments with the magnet on or off. In other embodiments, a selectable multi-level magnet may be used such that a variable feel of force required to depress a key may be selected. Moreover, with a magnetic key system, or maglev system, the same feel of a longer keystroke may be included in a thinner form factor by the magnetic resistance to the actuation of the key. Thus, a thinner and controllable key may be manufactured for keyboards and other systems.

A key assembly in embodiments of the present disclosure may include a key cap situated atop two scissor plates that may rotate outward from one another as a user applies downward force to the key cap (e.g., pressing the key). In embodiments of the present disclosure, the outward rotation of the scissor plates caused by the user applying downward force on the key cap may simultaneously cause a flange susceptible to magnetic forces which is operatively coupled to a scissor plate to rotate away from a magnet situated beneath the scissor plates. Once the user removes the downward force in such an embodiment, the magnet may exert a magnetic force to pull the flange operably connected to the scissor plate back toward the magnet. The flange may be comprised of a ferromagnetic material such as steel. This may cause the scissor plates to rotate toward one another, pushing the key cap back to its neutral position, flush with the surface of the keyboard In embodiments of the present disclosure, a switch contact structure may be operably connected to one of the scissors plates such that it comes into contact with another switch contact located beneath an electropermanent magent (EPM) when the user applies downward force to the key cap, rotating the scissor plates away from another. In such a way, embodiments of the present disclosure provide a mechanism for registering the occurrence of a keystroke without the use of the rubber dome device of conventional systems.

In order to decrease the thickness of a rubber dome keyboard, shorter rubber domes may be used, which results in a marked and negative difference in the user's tactile sensation between the thicker and thinner rubber dome keyboards. In contrast, decreasing the thickness of a keyboard, and replacing the rubber domes with EPM key assemblies does not negatively impact the user's tactile sensation in such a way. In addition to providing sufficient upward force to return the key back to its neutral position, use of such an EPM key assembly in an embodiment may supply a consistent upward force the user must overcome in order to depress the key cap far enough for the information handling system to register its depression as a keystroke. This resistive force may be tunable to feel to the user as if the key cap is travelling a deeper distance into the keyboard than it actually is.

The effect the magnetic field generated by the EPM has on the flange susceptible to magnetic forces in embodiments described herein may decrease as the flange moves away from the EPM. As such, the force required to displace the key cap from its neutral position to the depressed position where a keystroke is registered may vary as the key cap moves downward. More specifically, because the flange is closest to the EPM when the key cap is in its neutral position, the force required to move the key cap downward is greatest at the top of the keystroke, when the user first applies the downward pressure. This is also true for existing key assemblies employing rubber domes. However, an information handling system may not register the occurrence of the keystroke for an EPM based key assembly until the key cap reaches its bottom-most point, and the switch contact operably connected to the scissor plate comes into contact with the switch contact within the base assembly in some embodiments. In other embodiments, the bottom surface of a scissor plate may contact a pressure sensor situated atop the cap support plate. In some embodiments, registering the contact at the time at which the user applies peak force near the top of the keystroke to depress the key cap may be desired. A system is disclosed to synchronize these events and to bias the key to a depressed position in absence of a magnetic field.

Embodiments of the present disclosure employ a spring loaded rocker arm assembly to synchronize the point at which the information handling system registers a keystroke with the top of the keystroke. A leaf spring in embodiments described herein may provide a resistive or biasing force that counteracts the rotational force on the scissor plates caused by the EPM to raise the key to a neutral position. Simultaneously, the downward pressure supplied by the user at the top of the keystroke, in combination with this biasing force may cause the switch contact operably connected to the scissor plate to close by coming into contact with a switch contact located in the base the EPM. The information handling system in such an embodiment may then register the keystroke at the top of the keystroke, simultaneous with the application of maximum downward pressure by the user.

Embodiments of the present disclosure employ an EPM in the key assembly to provide an upward force to return each key cap to its neutral position when the EPM is on in that it provides a combined magnetic force with aligned low-coercivity magnet and high-coercivity magnet polarities. The EPM may be turned off by switching polarity of the low-coercivity magnet or magnets. In some embodiments discussed herein, this magnetic force and the corresponding upward force on the key cap may be selectable with a multi-level EPM or plural EPMs. Further, disabling the EPM in such a key assembly may cause the key cap to fall to a depressed position. This may be useful in guarding against inadvertent keystrokes, such as, when the information handling system has been placed in a tablet configuration, where the user is likely to enter information via a touch screen, rather than via the keyboard. This may also be useful in avoiding inadvertent contact between one or more key caps and the digital display when the information handling system is placed in a closed configuration. Biasing the key assembly to reach the depressed position without the presence of a magnetic field is another aspect of embodiments of the present disclosure.

A key cap currently included in a key assembly in which the EPM has been turned off may be pulled downward into the depressed position by the effects of gravity. However, such a gravitational pull alone may not be great enough to overcome the static friction keeping the scissor plates from rotating about their axes and apart from one another or the key assembly may be loose and move with movement of the keyboard to various orientations. For example, if the information handling system is placed in a closed configuration, the forces of gravity may cause the key caps to move up and down as the information handling system is in transport, potentially resulting in repeated inadvertent contact between one or more key caps and the digital display.

The spring within the embodiments of the present disclosure may also provide a bias lessening this static friction such that this spring biasing force may urge the key cap to move from the neutral position to the depressed position via the rocker arm when the EPM within the key assembly is disabled. Thus, the spring loaded rocker arm in embodiments of the present disclosure may provide the dual purposes of providing such a biasing force when the EPM is off and allowing the information handling system to register the key stroke at the top of the key stroke, for example, simultaneous with the user's application of maximum downward force on the key cap.

FIG. 1 illustrates an information handling system 100 similar to information handling systems according to several aspects of the present disclosure. In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system can be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a communications device, an access point (AP), a base station transceiver, a wireless telephone, a land-line telephone, a control system, a camera, a scanner, a facsimile machine, a printer, a pager, a personal trusted device, a web appliance, or any other suitable machine capable of executing a set of instructions (sequential or otherwise) that specify actions to be taken by that machine, and can vary in size, shape, performance, price, and functionality.

In a networked deployment, the information handling system 100 may operate in the capacity of a server or as a client computer in a server-client network environment, or as a peer computer system in a peer-to-peer (or distributed) network environment. In a particular embodiment, the computer system 100 can be implemented using electronic devices that provide voice, video or data communication. For example, an information handling system 100 may be any mobile or other computing device capable of executing a set of instructions (sequential or otherwise) that specify actions to be taken by that machine. Further, while a single information handling system 100 is illustrated, the term "system" shall also be taken to include any collection of systems or sub-systems that individually or jointly execute a set, or multiple sets, of instructions to perform one or more computer functions.

The information handling system can include memory (volatile (e.g. random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system can include one or more storage devices, one or more communications ports for communicating with external devices, as well as, various input and output (I/O) devices, such as a keyboard, a mouse, a video/graphic display, or any combination thereof. The information handling system can also include one or more buses operable to transmit communications between the various hardware components. Portions of an information handling system may themselves be considered information handling systems.

Information handling system 100 can include devices or modules that embody one or more of the devices or execute instructions for the one or more systems and modules described above, and operates to perform one or more of the methods described above. The information handling system 100 may execute code instructions 124 that may operate on servers or systems, remote data centers, or on-box in individual client information handling systems according to various embodiments herein. In some embodiments, it is understood any or all portions of code instructions 124 may operate on a plurality of information handling systems 100.

The information handling system 100 may include a processor 102 such as a central processing unit (CPU), control logic or some combination of the same. Any of the processing resources may operate to execute code that is either firmware or software code. Moreover, the information handling system 100 can include memory such as main memory 104, static memory 106, computer readable medium 122 storing instructions 124 of the electropermanent magnet keyboard control system 132, and drive unit 116 (volatile (e.g. random-access memory, etc.), nonvolatile (read-only memory, flash memory etc.) or any combination thereof). The information handling system 100 can also include one or more buses 108 operable to transmit communications between the various hardware components such as any combination of various input and output (I/O) devices.

As shown, the information handling system 100 may further include a video display 110. The video display 110 in an embodiment may function as a liquid crystal display (LCD), an organic light emitting diode (OLED), a flat panel display, a solid state display, or a cathode ray tube (CRT). Additionally, the information handling system 100 may include an input device 112, such as a cursor control device (e.g., mouse, touchpad, or gesture or touch screen input, and a keyboard 114. The information handling system 100 can also include a disk drive unit 116.

The network interface device shown as wireless adapter 120 can provide connectivity to a network 128, e.g., a wide area network (WAN), a local area network (LAN), wireless local area network (WLAN), a wireless personal area network (WPAN), a wireless wide area network (WWAN), or other network. Connectivity may be via wired or wireless connection. The wireless adapter 120 may operate in accordance with any wireless data communication standards. To communicate with a wireless local area network, standards including IEEE 802.11 WLAN standards, IEEE 802.15 WPAN standards, WWAN such as 3GPP or 3GPP2, or similar wireless standards may be used. In some aspects of the present disclosure, one wireless adapter 120 may operate two or more wireless links. The wireless network may have a wireless mesh architecture in accordance with mesh networks described by the wireless data communications standards or similar standards in some embodiments but not necessarily in all embodiments.

Wireless adapter 120 may connect to any combination of macro-cellular wireless connections including 2G, 2.5G, 3G, 4G, 5G or the like from one or more service providers. Utilization of radiofrequency communication bands according to several example embodiments of the present disclosure may include bands used with the WLAN standards and WWAN carriers, which may operate in both license and unlicensed spectrums. For example, both WLAN and WWAN may use the Unlicensed National Information Infrastructure (U-NII) band which typically operates in the ~5 MHz frequency band such as 802.11 a/h/j/n/ac (e.g., center frequencies between 5.170-5.785 GHz). It is understood that any number of available channels may be available under the 5 GHz shared communication frequency band. WLAN, for example, may also operate at a 2.4 GHz band. WWAN may operate in a number of bands, some of which are proprietary but may include a wireless communication frequency band at approximately 2.5 GHz band for example. In additional examples, WWAN carrier licensed bands may operate at frequency bands of approximately 700 MHz, 800 MHz, 1900 MHz, or 1700/2100 MHz for example as well. In the example embodiment, mobile information handling system 100 includes both unlicensed wireless radio frequency communication capabilities as well as licensed wireless radio frequency communication capabilities. For example, licensed wireless radio frequency communication capabilities may be available via a subscriber carrier wireless service.

In some embodiments, software, firmware, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with some various embodiments of the present disclosure, the methods described herein may be implemented by firmware or software programs executable by a controller or a processor system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions, parameters, and profiles 124 or receives and executes instructions, parameters, and profiles 124 responsive to a propagated signal, so that a device connected to a network 128 can communicate voice, video or data over the network 128. Further, the instructions 124 may be transmitted or received over the network 128 via the network interface device or wireless adapter 120.

The information handling system 100 can include a set of instructions 124 that can be executed to cause the computer system to perform any one or more of the methods or computer based functions disclosed herein. For example, instructions 124 may execute a electropermanent magnet keyboard control system 132, software agents, or other aspects or components. Various software modules comprising application instructions 124 may be coordinated by an operating system (OS), and/or via an application programming interface (API). An example operating system may include Windows®, Android®, and other OS types known in the art. Example APIs may include Win 32, Core Java API, or Android APIs.

The disk drive unit 116 and the electropermanent magnet keyboard control system 132 may include a computer-readable medium 122 in which one or more sets of instructions 124 such as software can be embedded. Similarly, main memory 104 and static memory 106 may also contain a computer-readable medium for storage of one or more sets of instructions, parameters, or profiles 124 including an estimated training duration table. The disk drive unit 116 and static memory 106 also contain space for data storage. Further, the instructions 124 may embody one or more of the methods or logic as described herein. For example, instructions relating to the electropermanent magnet keyboard control system 132 software algorithms may be stored here. In a particular embodiment, the instructions, parameters, and profiles 124 may reside completely, or at least partially, within the main memory 104, the static memory 106, and/or within the disk drive 116 during execution by the processor 102 of information handling system 100. As explained, some or all of the electropermanent magnet keyboard control system 132 may be executed locally or remotely. The main memory 104 and the processor 102 also may include computer-readable media.

Main memory 104 may contain computer-readable medium (not shown), such as RAM in an example embodiment. An example of main memory 104 includes random access memory (RAM) such as static RAM (SRAM), dynamic RAM (DRAM), non-volatile RAM (NV-RAM), or the like, read only memory (ROM), another type of memory, or a combination thereof. Static memory 106 may contain computer-readable medium (not shown), such as NOR or NAND flash memory in some example embodiments. The electropermanent magnet keyboard control system 132 may be stored in static memory 106, or the drive unit 116 on a computer-readable medium 122 such as a flash memory or magnetic disk in an example embodiment. While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of some or the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

The information handling system 100 may also include an electropermanent magnet keyboard control system 132 that may be operably connected to the bus 108. The electropermanent magnet keyboard control system 132 computer readable medium 122 may also contain space for data storage. The electropermanent magnet keyboard control system 132 may perform tasks related to controlling activation of the electropermanent magnet in some embodiments. In other embodiments, the electropermanent magnet keyboard control system 132 may perform tasks related to controlling the magnitude of the magnetic field generated by an electropermanent magnet within a key switch assembly. In some embodiments, a current applied to one or more coils of a plurality of low-coercivity magnets may correspond to a user-selected magnitude when a stepped electropermanent magnet system is used.

In an embodiment, the electropermanent magnet keyboard control system 132 may communicate with the main memory 104, the processor 102, the video display 110, the alpha-numeric input device 112, and the network interface device 120 via bus 108, and several forms of communication may be used, including ACPI, SMBus, a 24 MHZ BF SK-coded transmission channel, or shared memory. Keyboard driver software, firmware, controllers and the like may communicate with applications on the information handling system.

In other embodiments, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

When referred to as a "system", a "device," a "module," a "controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device). The system, device, controller, or module can include software, including firmware embedded at a device, such as an Intel® Core class processor, ARM® brand processors, Qualcomm® Snapdragon processors, or other processors and chipsets, or other such device, or software capable of operating a relevant environment of the information handling system. The system, device, controller, or module can also include a combination of the foregoing examples of hardware or software. Note that an information handling system can include an integrated circuit or a board-level product having portions thereof that can also be any combination of hardware and software. Devices, modules, resources, controllers, or programs that are in communication with one another need not be in continuous communication with each other, unless expressly specified otherwise. In addition, devices, modules, resources, controllers, or programs that are in communication with one another can communicate directly or indirectly through one or more intermediaries.

Figure 2:
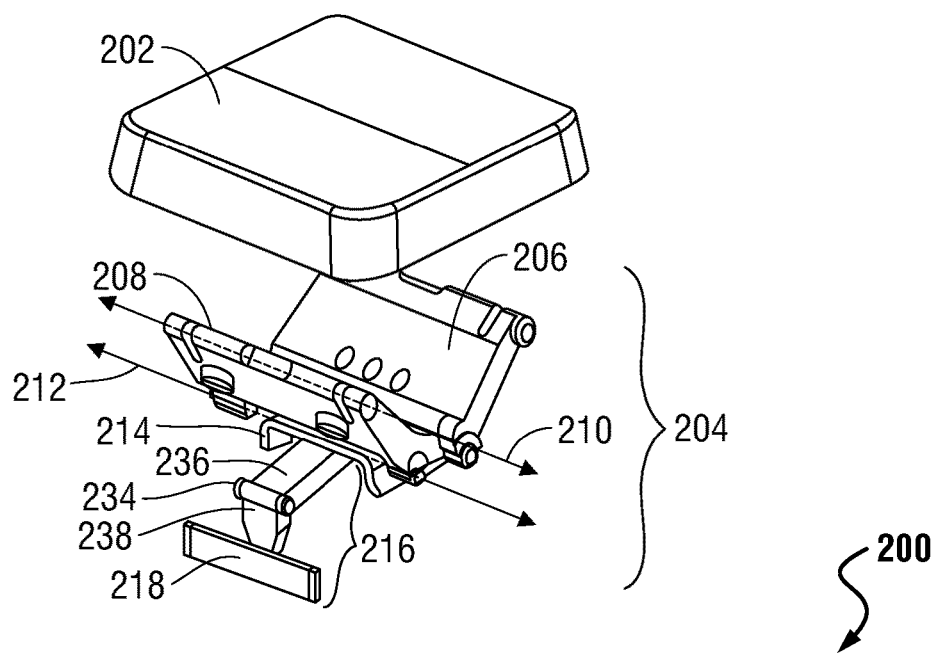
FIG. 2 is an exploded, perspective graphical diagram view of a key switch assembly with an electropermanent magnet (EPM) according to an embodiment of the present disclosure.
Figure 2:
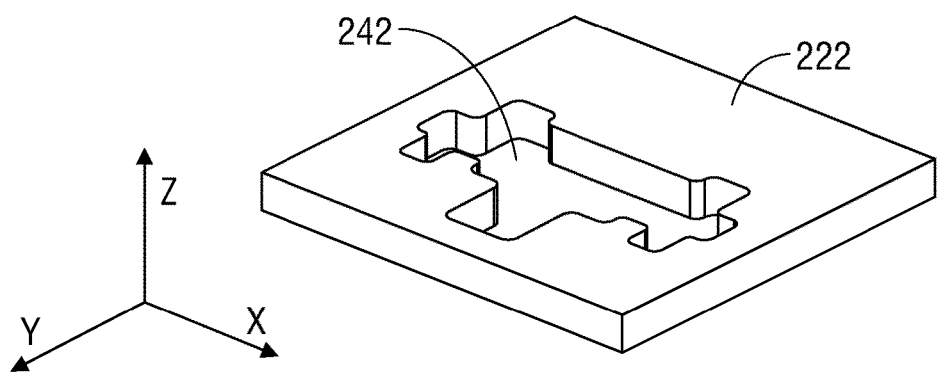
Figure 2:
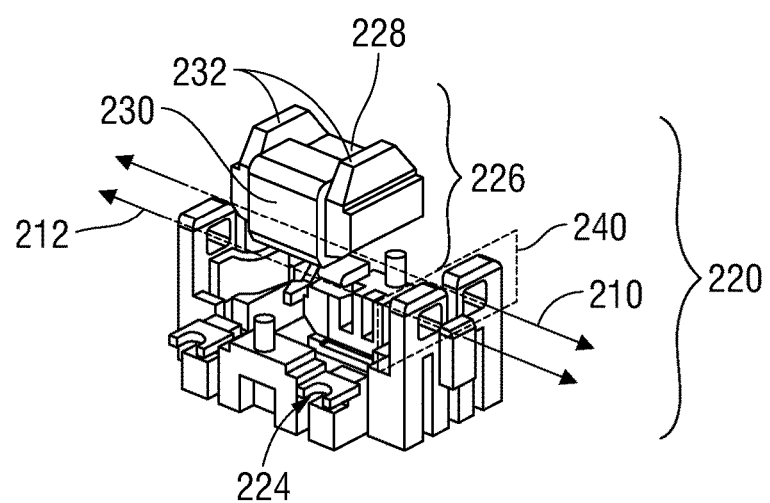

FIG. 2 is an exploded, perspective graphical diagram view of a key switch assembly 200 with an electropermanent magnet (EPM) 226 and a spring-biased rocker arm 236 and 238 operably connecting a scissor plate assembly 204 to a switch contact surface 218 according to an embodiment of the present disclosure. Switch contact surface 218 in an embodiment may be a leaf spring which acts as a biasing spring against rocker arm 238 and 236. A key switch assembly 200 in an embodiment may enable an information handling system to register a keystroke entered by a user via a keyboard. Each key within such a keyboard may be incorporated within a key switch assembly 200, and may comprise a key cap 202 lying atop a scissor plate assembly 204 in an embodiment.

The scissor plate assembly 204 in an embodiment may include a rear scissor plate 206 and a front scissor plate 208, the top portions of which (e.g., portions located furthest from a rotation axis) may rotate away from one another when a sufficient downward force is exerted on the key cap 202. Such a rotation in an embodiment may cause either a portion of the scissor plates 206 and 208 themselves, or a mechanism operably coupled to the scissor plates 206 and 208 to come into contact with a sensor to indicate the key has been depressed. In such a way, the rotation of the scissor plates 206 and 208 may be actuated while the information handling system to register occurrence of a keystroke.

The scissor plates 206 and 208 in an embodiment may be operably connected to a base contact assembly 220 fixed to the keyboard of the information handling system during operations of the key assembly 200. In an embodiment, base contact assembly 220 is fixe to a cap support plate 222, such as a printed circuit board (PCB), such that depression of the key cap 202 in an embodiment may not cause any vertical movement of the base contact assembly 220 during actuation. Each of the scissor plates 206 and 208 may be connected to the base contact assembly 220 such that the rotation axis for each of the scissor plates transects a cross-sectional area shared by the scissor plates 206 and 208 and the base contact assembly 220. For example, in an embodiment, the base contact assembly 220 may be inserted through a support plate integration opening 242 within a cap support plate 222 to join with the scissor plates 206 and 208. The cap support plate 222 in such an embodiment may be a surface onto which the base contact assembly 220 is soldered or otherwise affixed, and may provide a limit to which the key cap 202 may travel downward. In some embodiments, the cap support plate 222 may be a PCB, and in other embodiments, the cap support plate 222 may include a metallic plate for additional structure.

The cap support plate 222 in such an embodiment may provide a limit to which the key cap 202 may travel downward (in the negative Z direction). The scissor plates 206 and 208 may reach a maximum allowable angle of separation or rotation about their respective axes 210 and 212 when the cap support plate 222 obstructs further downward vertical movement of the key cap 202 in an embodiment. In such an embodiment, a pin or similar mechanism may join the scissor plates 206 and 208 to one or more scissor mounts 240 within the base contact assembly 220 to form one or more hinges. In the example embodiment illustrated by FIG. 2, the rear scissor plate 206 may be joined with the base contact assembly 220 at the scissor mounts 240 in such a way to form a hinge allowing the rear scissor plate 206 to rotate about the rear plate rotation axis 210 that transects a cross-sectional area (e.g., in the YZ plane) shared by both the rear scissor plate 206 and the base contact assembly 220. Similarly, the front scissor plate 208 may be joined with the base contact assembly 220 via the scissor mounts 240 to allow the front scissor plate 208 to rotate about the front plate rotation axis 212 transecting a cross-sectional area (e.g., in the YZ plane) shared by both the front scissor plate 206 and the base contact assembly 220. In other embodiments, the scissor mounts 240 may be integrated within the cap support plate 222, rather than the base contact assembly 220. In still other embodiments, the front scissor plate 208 and rear scissor plate 206 may share a single rotational axis.

As a downward force is exerted on the key cap 202, the portions of the rear scissor plate 206 and front scissor plate 208 located opposite their respective rotation axes 210 and 212 may move away from one another in the Y-direction. In previous keyboard systems, such a separation may expose the key cap to the top portion of a rubber dome structure housed within the scissor plate assembly 204, such that the key cap would cause the dome structure to deform. Upon such a deformation in previous systems, a portion of the dome structure itself, or a secondary structure within the dome structure would be pushed downward, below the rotation axes 210 and 212 to contact a sensor element. Such a sensor element may be located in such prior systems, for example, on the surface of the cap support plate 222, or within the base contact assembly 220. The information handling system in such previous systems may then register the contact between the sensor and the dome structure (or its internal secondary structure) as a keystroke, at the bottom of the keystroke. When the downward force used to deform the rubber dome structure is removed in such previous systems, the rubber dome structure would automatically return to its undeformed shaped, causing the key cap to return to its neutral position having a top surface flush with the other keys in the keyboard. Rubber dome structures of these previous systems do not allow for a plurality of positions such as neutral or depressed, nor an adjustable upward force the user must overcome to depress the keys.

Embodiments of the present disclosure involve magnetically levitated keys and may use methods to register keystrokes that do not require such rubber dome structures. For example, a scissor plate switch contact 218 is a leaf spring in an embodiment and may be operably connected to a rocker arm 236 and 238 and connected to the cap support plate 222 via a hinge 234 about which the rocker arm 236 and 238 may rotate. Upon final construction of the whole key switch assembly 200 in an embodiment, the rocker arm portion 238 may extend outward in the Y-direction, such that one or more ends of the scissor plate switch contact 218 are aligned with and may be actuated to contact the base switch contact 224 by action of the leaf spring scissor plate switch contact 218. While in the neutral position, the magnetic field of the EPM 226 may pull the scissor plate EPM flange 214 downward toward the EPM 226, causing the bottom surface of the flange 214 to come into contact with the top surface of the portion of the rocker arm 216 closest to the flange 214. This contact may cause the rocker arm inner portion 236 and outer portion 238 to rotate about its hinge 234, such that the scissor plate switch contact 218 leaf spring is pushed out in the Y-direction away from the base switch contact 224.

In various embodiments, scissor plate switch contact 218 may be affixed at one end or both ends such that the leaf spring may be affixed on one or both sides. If on one side, the scissor plate switch contact 218 may swing on a fixed end such that the other end contacts the base switch contact 224 on the opposite side in an embodiment. In another embodiment, scissor plate switch contact 218 may be fixed on both sides such that the leaf spring of the scissor plate switch contact 218 toward the EPM rotates the fixed ends causing a portion of one or both ends to swivel and contact a base switch contact 224.

When the key cap 202 is forced down to its depressed position in such an embodiment, the rotation of the upper portions of scissor plates 206 and 208 away from one another (in the Y-direction) may cause the scissor plate EPM flange 214 to rotate upward such that it releases the rocker arm 216, allowing the rocker arm to rotate such that the scissor plate switch contact 218 leaf spring relaxes inward and the ends contact the base switch contact 224. This contact may close a circuit, which the information handling system in an embodiment may register as a key stroke.

As described herein, embodiments of the present disclosure are an improvement on other magnetic keyboard systems. For example, the key switch assembly 200 in an embodiment may include an electropermanent magnet (EPM) housed within the base contact assembly 220 in an example embodiment. An electropermanent magnet, such as EPM 226 may include one or more high-coercivity magnets 228 situated nearby one or more low-coercivity magnets 230. The low-coercivity magnets 230 in an embodiment may be comprised of a combination of aluminum, nickel, and cobalt, for example AlNiCo. Such low-coercivity magnets may be subject to polarity changes when a current is applied across a coil wrapped around the low-coercivity magnet 230 (shown encased in FIG. 2). Other embodiments contemplate the use of other materials, or other combinations that include these materials or others, including iron, and nitrogen. The high-coercivity magnets 228 in an embodiment may be comprised of a combination of Neodymium, Iron, and Boron. Other embodiments contemplate the use of any of these materials individually, of other materials, or of other combinations that include these materials or others generally used to create permanent magnets, including ferrous platinum, a combination of dysprosium, niobium, gallium and cobalt, and samarium-cobalt.

An electrically conductive wire (e.g., copper wire) may be coiled around the low-coercivity magnets 230 in an embodiment. The EPM keyboard control system in an embodiment may apply a pulse of current in a first direction through the electrically conductive wires coiled around one or more of the low-coercivity magnets 230, causing a switch in polarity such that the poles of the low-coercivity magnets 230 line up with the poles of the high-coercivity magnets 228. In such an embodiment, the magnetic fields of the high-coercivity magnets 228 and low-coercivity magnets 230 may compound to generate a magnetic field having an intensity greater than that of either the high-coercivity magnetic field or the low-coercivity magnetic field alone. Such a combined magnetic field may also be propagated by one or more magnetically soft shunts 232 within the base contact assembly 220. The compound magnetic force generated by both the high-coercivity magnets 228 and the low-coercivity magnets 230 in such an embodiment may maintain this magnitude until another current pulse is applied to the electrically conductive wire. Thus, embodiments of the present disclosure capitalize on the advantage of electropermanent magnets to maintain a constant magnetic field intensity with only a pulse of current. In contrast, electromagnets require ongoing application of voltage to one or more magnetic components, thus depleting energy resources more quickly.

In another aspect of an embodiment, the EPM keyboard control system may apply a current in a second direction, opposite the first direction, causing the polarity of the magnetic field generated by the low-coercivity magnet 230 to reverse. In such an embodiment, the poles of the magnetic field generated by the high-coercivity magnets 228 may lie opposite the poles of the magnetic field generated by the low-coercivity magnets 230. The magnetic field of the high-coercivity magnet 228 may thus negate the magnetic field of the low-coercivity magnets 230, disabling the EPM 226 such that the total magnetic force of the EPM 226 is zero or of a very low magnitude. Upon application of a reverse current pulse, the polarity of the low-coercivity magnet or magnets 230 reverses and neutralizes the high-coercivity magnet 228 effectively turning off or turning down the electropermanent magnet 226.

Embodiments of the present disclosure may employ a single EPM 226, including only one high-coercivity magnet 228 and one low-coercivity magnet 230. Such a single EPM system may be capable of achieving two separate states. First, the single EPM system may achieve an on state, in which the EPM 226 generates a combined magnetic field from the high-coercivity magnet and the low-coercivity magnet. Second, the single EPM system may achieve an off state, in which the magnetic field generated by the high-coercivity magnet negates the magnetic field generated by the low-coercivity magnet. Use of an EPM with the key assembly in embodiments herein enables a decreased the thickness of the keyboard but does not negatively impact user experience because the key may feel as though it is travelling further or deeper into the keyboard due to the force required to overcome the EPM magnetic force when the EPM is activated.

In another embodiment, a multi-level-EPM may include one or more high-coercivity magnets 228 and two or more low-coercivity magnets 230. Each of the low-coercivity magnets 230 in such an embodiment may be capable of receiving a current burst independent of the other. Combinations of the polarity alignments of the low-coercivity magnets 230 relative to the one or more high-coercivity magnets 228 may yield a variety of magnetic levels. For example, the EPM keyboard control system in such an embodiment may apply a first current to a first low-coercivity magnet, causing the magnetic field of the first low-coercivity magnet to partially combine with the magnetic field of a first high-coercivity magnet. Simultaneously, the EPM keyboard control system in such an embodiment may apply a second current to a second low-coercivity magnet, causing the magnetic field of the second low-coercivity magnet to partially negate the magnetic field of the high-coercivity magnet for one magnetic level or a reverse second current may cause the second low-coercivity magnet to partially combine with the high-coercivity magnet for a third magnetic level. In such a way, the EPM keyboard control system in an embodiment may be capable of placing a multilevel-EPM 226 in one of three or more different states. Combinations of low-coercivity magnets and high-coercivity magnets may be used to provide multiple, adjustable magnetic levels in some embodiments. Further gradation in overall magnetic field strength for the EPM 226 may be achieved in other embodiments by including more than two EPMs within the key assembly 200, or by applying multiple current pulses of increasing amplitude to a single low-coercivity magnet (to increase its magnetic field strength in a step-wise fashion). The EPM keyboard control system in an embodiment may thus adjust the magnitude of the total magnetic field generated by the EPM 226 by controlling the direction of current applied to one or more electrically conductive wires coiled around one or more low-coercivity magnets 230.

The EPM 226 in an embodiment may cause the key cap 202 to return to its neutral position following depression by forcing the scissor plates toward one another. In an embodiment, such a force may be generated by magnetically attracting a structure operably connected to one or more of the scissor plates down toward the EPM 226. For example, the EPM 226 in an embodiment may generate a magnetic field that attracts a scissor plate flange 214 susceptible to magnetic forces down toward the EPM 226. The flange 214 in an embodiment may be comprised of a ferromagnetic material, such as iron, or steel. In such an embodiment, the scissor plate flange 214 may be operably connected to the rear scissor plate 206, and may extend from the base of the rear scissor plate, beyond the rear scissor plate rotation axis 210 in the positive Y direction. When operably connected in such a configuration, any rotation of the scissor plate flange 214 about the rear plate rotation axis 210 may cause a rotation of the rear scissor plate 206 in the same direction about the rear plate rotation axis 210. For example, a rotation of the flange 214 about the rear plate rotation axis 210 that is counter-clockwise in the Y-Z plane may cause a counter-clockwise rotation of the top of the rear scissor plate 206 about the rear plate rotation axis 210. This counter-clockwise rotation may occur, for example, when the scissor plate flange 214, or a portion thereof is drawn downward toward the EPM 226. Thus, the attraction of the flange 214 toward the EPM 226 may cause the top portion of the rear scissor plate 206 to rotate toward the top portion of the front scissor plate 208, forcing the key cap 202 upward.

The upward force on the key cap 202 caused by the magnetic attraction between the flange 214 and the EPM 226 in an embodiment may also control the force with which a user must press down on the key cap 202 in order for the information handling system to register a keystroke. The magnetic field may be generated by the EPM 226 in an embodiment throughout the vertical movement of the key cap 202 in an embodiment. Thus, a force great enough to overcome the magnetic attraction between the flange 214 and the EPM 226 must be applied to the key cap 202 in order for the contact element within or operably connected to the scissor plate assembly 204 to come into contact with the contact element or other sensor within either the cap support plate 222 or the base contact assembly 220. As described herein, such a contact may be needed in order to register a keystroke. By controlling the magnitude of the combined magnetic field of the EPM 226 in an embodiment, the EPM keyboard control system may also control the degree of force required to register a keystroke.

Because each key assembly 200 may include an individually controllable EPM 226 in an embodiment, the EPM keyboard control system may adjust the force needed to depress the key cap on a key-by-key basis, such that some keys require more force than others. In other embodiments, by disabling the EPM 226 completely, the EPM keyboard control system may ensure the key cap 202 does not return to its neutral position, thus disallowing the user to enter a keystroke with that key. This may be useful, for example, when the information handling system is a laptop placed in a closed configuration in which the keyboard is placed nearby or in close contact with the display screen. In such an embodiment, the EPM keyboard control system may detect that the laptop has been placed in the closed configuration, and disable the EPMs for all of the keys in the keyboard to draw the key caps away from the display screen such that they do not cause frictional wear and tear on the display. In another aspect, this retractability may be useful in a gaming scenario in which the key being actuated represents an action currently unavailable to the user (e.g., firing of an unavailable weapon in a first-person-shooter computer game).

Further, the EPM keyboard control system in an embodiment may set a force needed to depress one of more keys according to external stimuli in one embodiment. For example, the information handling system in an embodiment may detect (e.g., via rotation sensors, hall sensors, proximity sensing elements, gyroscopes, etc.) that the information handling system has been placed in a closed or tablet configuration in which the keyboard is not likely to be used. In such an embodiment, the EPM keyboard control system may cause the EPM to stop generating a combined magnetic field, such that the keys cannot be actuated. In such a way, the user may continue to use the information handling system in tablet mode without the risk of erroneous keystrokes. Similarly, by placing the keys in a locked depressed position when the information handling system is in a closed configuration, the EPM keyboard control system in an embodiment may remove the risk of key caps damaging the digital display through unintentional contact between the two.

As another example, the EPM keyboard control system may set the force needed according to a received user input in another embodiment. This may allow each individual user to set the force required to press keys on the keyboard to a level that is tactilely pleasing to the user. This facet of the EPM keyboard control system may also provide the user with an adjustable sensation that the keys are travelling a longer or shorter vertical distance (e.g. deeper or shallower into the keyboard) by requiring more or less force to register a keystroke. In these ways, the EPM keyboard control system may cause the key switch assembly 200 to provide an upward force to return each key cap to its neutral position, cause the key switch assembly 200 to remain in a fixed depressed position that disallows the user to register a keystroke, and/or apply a user-specified (or externally triggered) resistive force that may be adjusted on a key by key basis in various embodiments herein.

Figure 3:
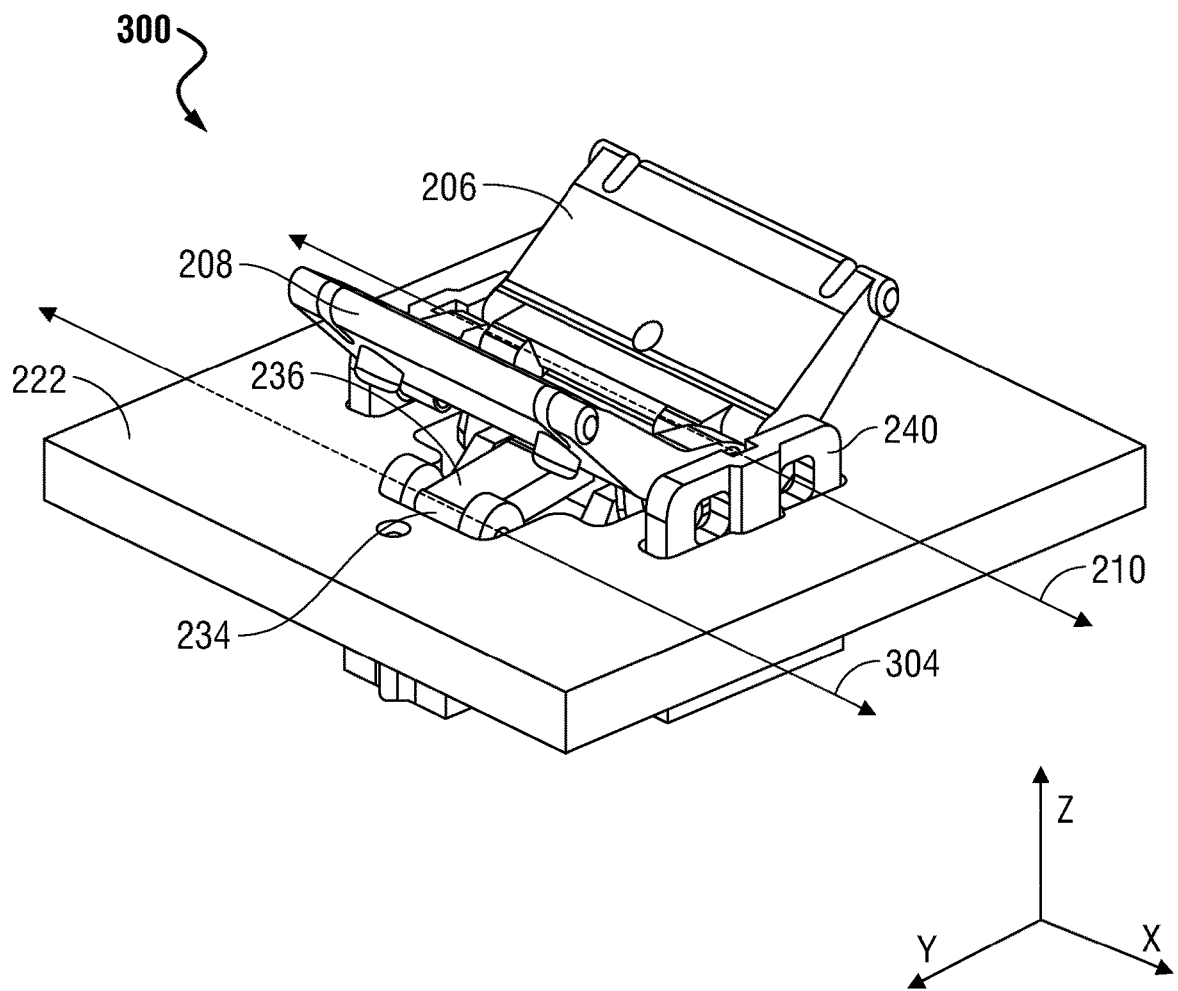
FIG. 3 is a graphical diagram perspective view of a scissor plate assembly operably attached to a base assembly according to an embodiment of the present disclosure.

FIG. 3 is a graphical diagram perspective view of a key switch assembly 300 with a scissor plate assembly operably attached to a base assembly disposed through an opening in a cap support plate according to an embodiment of the present disclosure. As described herein, the scissor plate assembly including rear scissor plate 206 may be partially inserted through a cap support plate 222 to join with a base assembly scissor mount 240 of a base contact assembly. The cap support plate 222 in such an embodiment may provide a limit to which the key cap (not shown) lying atop the rear scissor plate 206 and front scissor plate may travel downward (in the negative Z direction).

The cap support plate 222 may obstruct downward vertical movement of the key cap situated atop the scissor plates 206 and 208 beyond a preset height in an embodiment. For example, as the key cap travels downward pursuant to force applied by the user at the beginning of a keystroke, the portion of the rear scissor plate 206 located opposite the rear plate rotation axis 210 may rotate downward (in the negative Z direction) toward the cap support plate 222. The cap support plate 222 may be fixed to the base assembly scissor mount 240 of a base contact assembly or to another rigid structure of the keyboard such that it does not move vertically with respect to the base contact assembly and EPM within the base contact assembly. Thus, when the rear scissor plate 206 rotates downward until its bottom surface comes into contact with the top surface of the cap support plate 222, the fixed-position cap support plate 222 may inhibit further rotation of the rear scissor plate 206 which may, in turn, obstruct further downward movement (in the negative Z direction) of the key cap (not shown) that would be situated atop the rear scissor plate 206 and the front scissor plate. This obstruction of further downward movement of the key cap may be referred to herein as the bottom of the keystroke, or lowest position (in the Z direction) the key cap may reach during operation of the key assembly.

In some systems, a pressure sensor or electrical contact element may have been disposed across one or more portions of the cap support plate 222 to sense when the bottom face of the rear scissor plate 206 comes into contact with the top surface of the cap support plate 222. In such previous systems, the information handling system may register a keystroke at the bottom of the keystroke, upon such a sensed contact between the rear scissor plate 206 and the cap support plate 222. However, synchronizing the registering of the keystroke with the top of the keystroke, where the user perceives it has actuated the key may provide a desirable user experience in other embodiments. The EPM key switch assembly in an embodiment may employ a scissor plate switch contact operably connected to the rear scissor plate 206 that comes into contact with a base switch contact within the base contact assembly at the top of the keystroke to indicate occurrence of a keystroke according to one embodiment.

A rocker arm that includes the inner rocker arm 236 and an outer rocker arm (obscured from view by cap support plate 222) may allow movement of the rear scissor plate 206 to affect movement of the scissor plate switch contact in an embodiment. The inner rocker arm 236 may be fixed to the outer rocker arm (not shown) at a rocker arm joint 234, such that rotation of the inner rocker arm 236 about a rocker arm joint rotation axis 304 fixed to the cap support plate 222 may cause a corresponding rotation of the outer rocker arm, as described in greater detail with reference to FIG. 4. For example, a pin or similar mechanism fixed to the cap support plate may be disposed throughout the joint 234 between the inner rocker arm 236 and the outer rocker arm, such that the joint 234 between the two arms does not move vertically with respect to the cap support plate 222.

Such a joint 234 in some embodiments may be optionally operably connected to a torsional spring exerting a counterclockwise rotational force on the joint 234 about the rocker arm joint rotation axis 304. In other words, in such embodiments, the torsional spring may apply a constant biasing rotational force tending to rotate the inner rocker arm 236 in a counterclockwise motion about the axis 304, in the absence of other forces. In another embodiment, the scissor plate switch contact (not shown) may be a leaf spring causing the constant rotational force tending to rotate the inner rocker arm 236 in a counterclockwise motion about the axis 304, as described in greater detail with respect to FIG. 4. Such a counterclockwise motion of the inner rocker arm 236 in an embodiment may also cause the rear scissor plate 206 to rotate in a clockwise direction about the axis 210, toward the cap support plate 222. Thus, in the absence of other forces (e.g., the force of the magnetic field generated by the EPM) the torsional spring, or leaf spring in such embodiments may bias the key assembly toward its fully depressed position where the cap support plate 222 inhibits further downward movement of the key cap.

Figure 4:
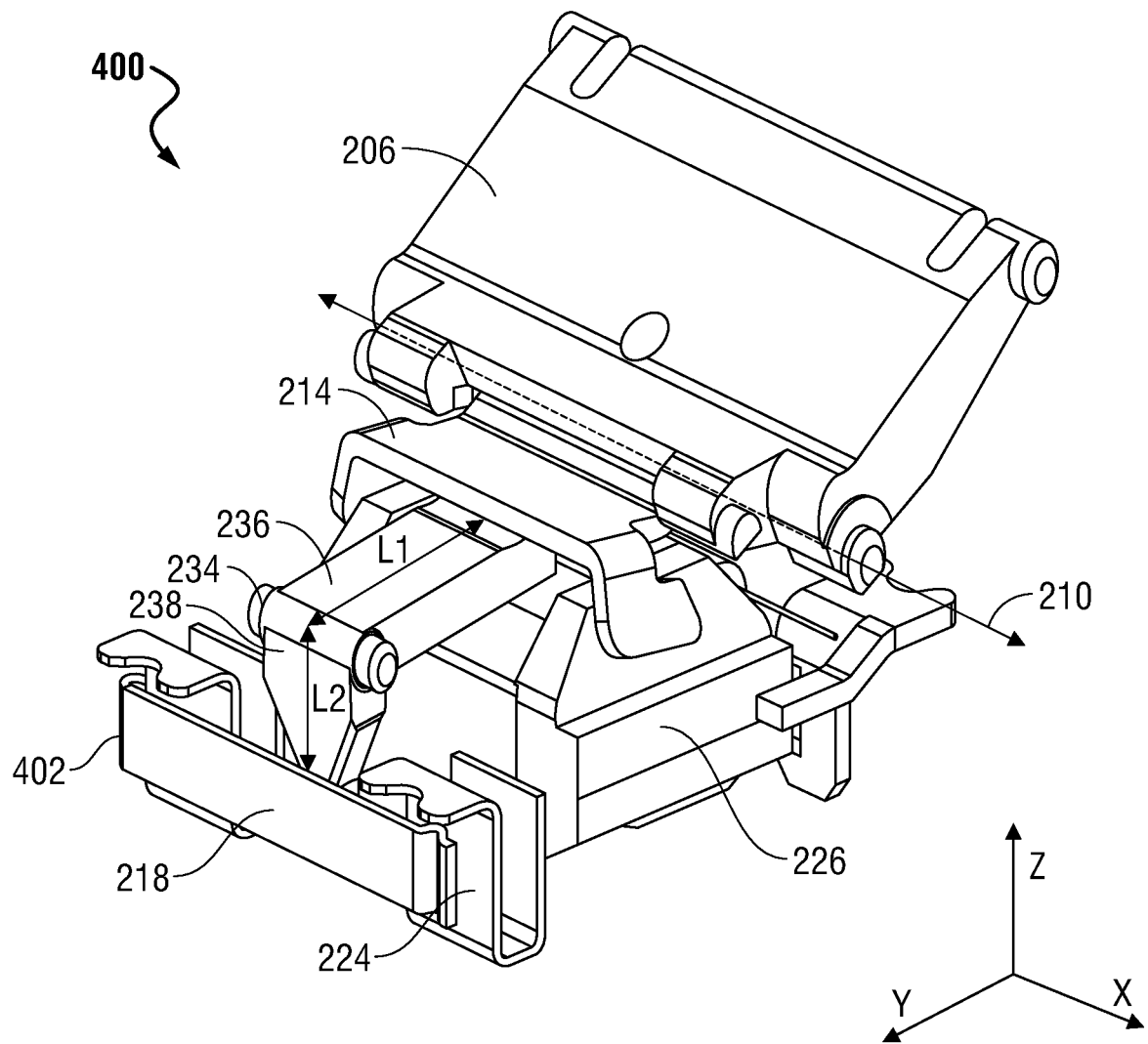
FIG. 4 is a graphical cut-away diagram perspective view of a rocker arm operably connecting a partial scissor plate assembly and a scissor plate switch contact according to an embodiment of the present disclosure.

FIG. 4 is a graphical cut-away diagram perspective view of a partial key switch assembly 400 according to an embodiment of the present disclosure. Key switch assembly 400 includes a rocker arm 236 and 238 operably connecting a scissor plate 206 and a scissor plate switch contact 218 such that the scissor plate switch contact 218 comes into contact with a base switch contact 224 upon actuation of the keystroke according to an embodiment of the present disclosure. As described herein, a rocker arm 236 and 238 may be used as part of a mechanism for registering a keystroke at the top of the keystroke, rather than the bottom of the keystroke, and for pulling the key assembly into a fully depressed position when the EPM is disabled.

A rocker arm that includes the inner rocker arm 236 and an outer rocker arm 238 may cause movement of the rear scissor plate 206 to affect movement of the scissor plate switch contact 218 in an embodiment. In one embodiment, the scissor plate switch contact 218 may comprise an electrically conductive leaf spring anchored at the leaf spring eye 402 to the base assembly. The scissor plate switch contact 218 in such an embodiment may have a neutral position, or a position in the absence of other forces whereby the leaf spring relaxes, that tends to push the end portion of the scissor plate switch contact 218 located opposite the anchor 402 toward the base contact 224. When anchored only on one side, the scissor plate switch contact 218 may swing on the fixed end at leaf spring eye 402 such that the other end contacts the base switch contact 224 on the opposite side to record a keystroke in an embodiment. In such an embodiment, the scissor plate switch contact 218 may be separated from the base contact 224 only upon application of force in the positive Y-direction sufficient to deform the scissor plate switch contact 218 such that it moves away from the base contact 224. The information handling system in an embodiment may register a keystroke upon contact between the scissor plate switch contact 218 and the base contact 224 when the leaf spring is allowed to relax inward toward the EPM base by the rocker arm 236 and 238. The force of the leaf spring tending to place the scissor plate switch contact in contact with the base contact 224 may comprise one aspect of the spring biasing force in an embodiment.

In another embodiment not depicted in FIG. 4, scissor plate switch contact 218 may be affixed at both ends such that the leaf spring may be affixed on one or both sides. The leaf spring that is scissor plate switch contact 218 may distend in the middle upon force in the Y direction away from the EPM by the outer portion 238 of the rocker arm. According to such an embodiment, as the leaf spring of the scissor plate switch contact 218 relaxes toward the EPM, the ends of the scissor plate switch contact 218 rotate about the fixed ends causing a portion of one or both ends to swivel and make contact a base switch contact 224. Such a contact may register a keystroke in such an embodiment.

In an embodiment in which the scissor plate switch contact 218 comprises a leaf spring, or is operably attached to a leaf spring anchored at 402, the biasing force of the leaf spring may cause the inside surface of the scissor plate switch contact 218 to come into contact with the outer surface of the outer rocker arm 238. In such a scenario, the biasing force may thus cause the outer rocker arm 238 to rotate in a counter-clockwise direction about the hinge 234. The angle between the inner rocker arm 236 and outer rocker arm 238 in such an embodiment may be fixed, such that a counter clockwise motion of the outer rocker arm 238 causes a corresponding counter clockwise motion of the inner rocker arm 236 about the hinge 234.

In another embodiment, a torsional spring may provide the biasing force, rather than a leaf spring. The scissor plate switch contact 218 in such an embodiment may be fixed to a bottom portion of the outer rocker arm 238, and may not be anchored to the base contact assembly. In such an embodiment, the whole of the scissor plate switch contact 218 may be free to move in the Y direction with respect to the base contact 224. Clockwise rotation of the outer rocker arm 238 about the rocker arm joint 234 in such an embodiment may cause the scissor plate switch contact 218 to move away from the base switch contact 224 in an embodiment where the scissor plate switch contact 218 is anchored at one end or side. In another embodiment where both ends are anchored, one or more ends may rotate away from contact with one or more base switch contacts 224. In contrast, counterclockwise rotation of the outer rocker arm 238 about the rocker arm joint 234 may cause the scissor plate switch contact 218 to move toward the base switch contact 224 in one embodiment or have one or both ends rotate into contact with one or more base switch contacts 224 in another embodiment. When one or both ends (in the X direction) of the scissor plate switch contact 218 in an embodiment come into electrically conductive contact with the base assembly and base switch contact 224, a circuit may be closed causing the information handling system to register that a keystroke has occurred. In some embodiments, a pressure contact may be used at base switch contact 224 or an electrical contact may be used in other embodiments.

In another embodiment, a torsional spring associated with the joint 234 in such an embodiment may exert a counterclockwise rotational force on the joint 234 about the rocker arm joint rotation axis. In other words, in such embodiments, the torsional spring may apply a constant rotational force tending to rotate the inner rocker arm 236 in a counterclockwise motion about the axis, in the absence of other forces. Still other embodiments contemplate the use of other springs or mechanisms capable of providing a biasing force tending to maintain contact between the scissor plate switch contact 218 and the base contact 224.

In the absence of other forces (e.g., the force of the magnetic field generated by the EPM 226 in the base assembly 220, and/or a user's downward force on the key cap) the biasing force provided by the torsional spring, leaf spring, or other spring in embodiments described herein may bias the scissor plate switch contact 218 to maintain contact with the base contact 224, causing a constant counter-clockwise rotation of the outer rocker arm 238 about the joint 234. As described herein, the joint 234 may be fixed to a cap support plate (not shown) such that the rocker arm joint 234 does not move vertically with respect to the EPM 226. Thus, counterclockwise motion of the outer rocker arm 238 about the rocker arm joint 234 in such an embodiment may cause a corresponding counterclockwise motion of the inner rocker arm 238. Such a counterclockwise motion about the axis of the rocker arm joint 234 in an embodiment may cause the portion of the inner rocker arm 236 opposite the rocker arm joint 234 to come into contact with the bottom surface of the scissor plate flange 214 and to rotate the flange 214 upward, or clockwise with respect to the rear plate rotation axis 210. The rear scissor plate 206 operably connected to the flange 214 in an embodiment may consequently also rotate clockwise about the axis 210, such that the bottom surface of the rear scissor plate 206 moves in the negative Z direction, toward the cap support plate. In other words, the biasing force provided by the torsional spring, leaf spring, or other mechanism in an embodiment may cause the entire key assembly to tend toward its fully depressed position where the cap support plate inhibits further downward movement of the key cap in the absence of other forces acting on the key assembly.

Further, such a biasing force in an embodiment may be sufficient to overcome the force of gravity alone to place the key assembly in its fully depressed position when the key assembly is turned upside down (e.g., with the key cap situated having the lowest position in the Z direction with respect to the rest of the key assembly). The biasing force exerted on the various portions of the key assembly in an embodiment may vary with the material, length and/or thickness of the scissor plate switch contact 218, the length (L1) of the inner rocker arm 236, and length (L2) of the outer rocker arm 238, and the strength of the torsional spring or other spring used.

When the key assembly is placed in its neutral position, in which the portion of the rear scissor plate 206 opposite the rear plate rotation axis 210 reaches its highest allowable vertical position (and the key cap is flush with other keys in the keyboard), a static friction force may cause the rear scissor plate 206 to maintain this position, in the absence of other forces. For example, in an embodiment that does not include a mechanism providing a biasing force, and in which the EPM 226 is disabled, the key assembly may stay in the neutral position until a force greater than the static friction force causes the key assembly to move away from the neutral position. Addition of the biasing force (e.g., as provided by a leaf spring or torsional spring) may provide such a force to overcome the static friction in an embodiment in which the EPM 226 is disabled. Thus, the biasing force of such a spring in an embodiment may effectively cause the switch assembly to move into the depressed position when the EPM 226 is disabled.

The inner and outer rocker arms in an embodiment may have a length (L1 and L2, respectively) sufficient such that the rotational force on the inner rocker arm, caused by the biasing spring is greater than a static friction tending to keep the key assembly in its neutral position. The magnitude the force the inner rocker arm 236 exerts on the bottom surface of the flange 214 to rotate the flange clockwise with reference to the axis 210 may increase as the length (L1) of the inner rocker arm 236 increases. In contrast, the magnitude of the force the scissor plate switch contact 218 provides to rotate the outer rocker arm 238 in a counterclockwise motion with reference to the joint or hinge 234 in an embodiment employing a leaf spring may increase the length (L2) of the outer rocker arm 238 increases. The lengths L1 and L2 of the inner rocker arm 236 and outer rocker arm 238, respectively, may be determined in an embodiment such that the force exerted by the inner rocker arm 236 on the bottom surface of the flange 214 is lesser than the magnetic force exerted by the EPM 226 to pull the flange 214 into its neutral position when the EPM 226 is active, and greater than the static friction force tending to keep the key switch assembly in its neutral position when the EPM 226 is deactivated.

Figure 5:
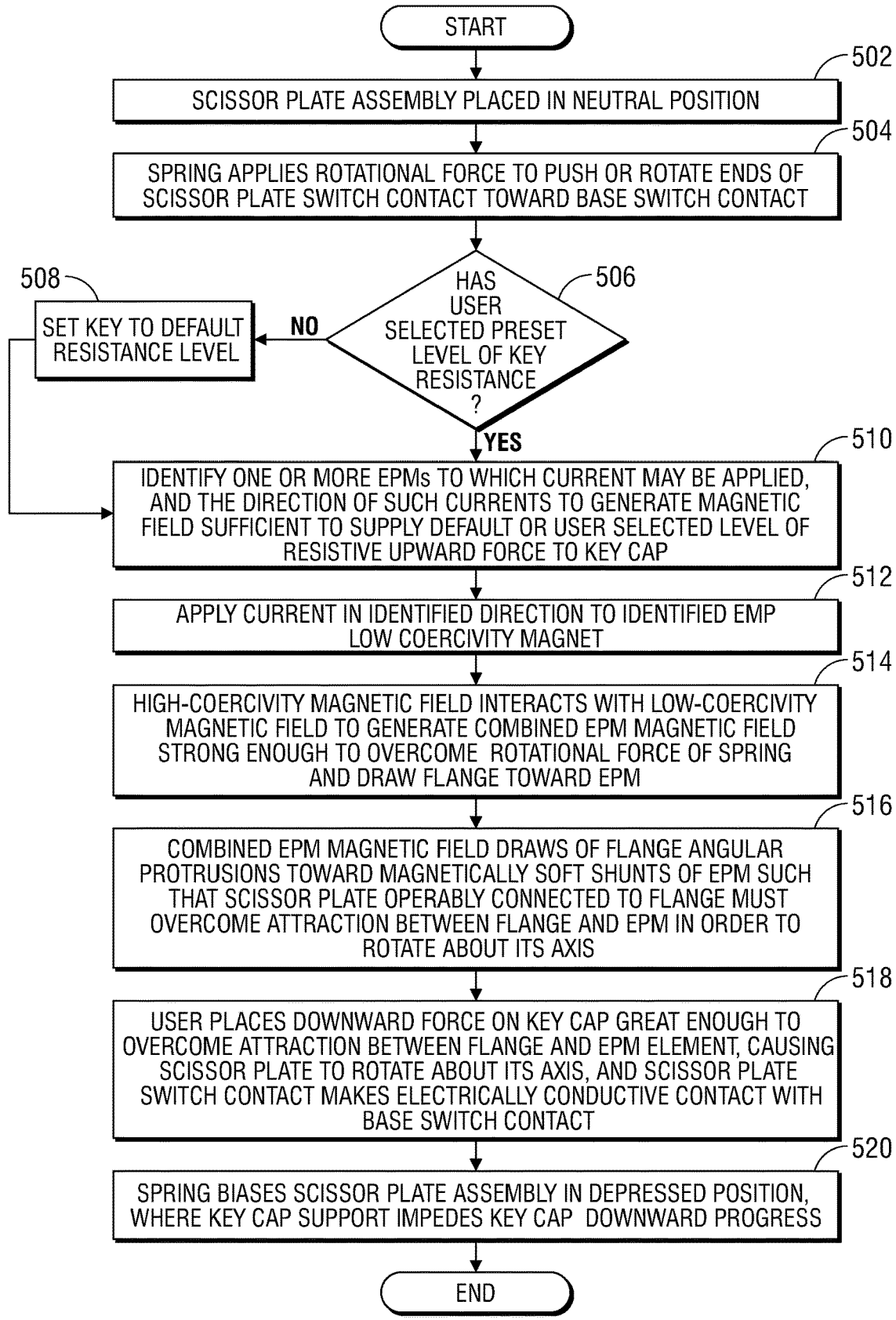
FIG. 5 is a flow diagram illustrating a method of synchronizing contact of a scissor plate switch contact with a base switch contact with the a keystroke according to an embodiment of the present disclosure.

FIG. 5 is a flow diagram illustrating a method of synchronizing contact of a scissor plate switch contact with a base switch contact causing an information handling system to register occurrence of a keystroke with the top of a keystroke, rather than the bottom of the keystroke according to an embodiment of the present disclosure. As described herein, the force required to displace the key cap from its neutral position to the depressed position where a keystroke is registered may vary as the key cap moves downward. More specifically, because the flange is closest to the EPM when the key cap is in its neutral position, the force required to move the key cap downward is greatest at the top of the keystroke, when the user first applies the downward pressure. However, the information handling system in previous systems may not register the occurrence of the keystroke until the key cap reaches its bottom most point, and the bottom surface of a scissor plate contacts a pressure sensor or other contact situated atop the cap support plate, or deformation of a rubber dome structure causes contact between two mechanisms beneath the rubber dome. It may be tactilely desired to have the contact registered at the time at which the user applies peak force to depress the key cap. The method described with reference to FIG. 5 provides for the information handling system to register the occurrence of the keystroke at or nearer to the top of the keystroke than previous key assemblies, coincident with the user applying the greatest downward force in some embodiments.

At block 502, the scissor plate assembly in an embodiment may be placed in a neutral position. For example, in an embodiment described with reference to FIG. 2, the key assembly is in a neutral state when no downward force is being exerted on the key cap. In such a state, neither the front scissor plate 208 nor the rear scissor plate 206 may be rotated about their respective axes 210 and 212 in an embodiment. Also, in an embodiment described with reference to FIG. 2, the top surface of the key cap 202 may be lying flush with adjacent key caps within the keyboard, and the scissor plate contact 218 and base contact 224 may not be in contact with one another while the scissor plate assembly 204 is in its neutral state.

At block 504, a biasing force may affect a rotational force to urge the scissor plate switch contact toward the base switch contact in an embodiment. For example, in an embodiment described with reference to FIG. 4, a spring (e.g., torsional spring, leaf spring, or other mechanism) in an embodiment may provide a biasing force tending to rotate the outer rocker arm 238 in a counterclockwise motion about the axis of the rocker arm joint 234. As a spring or other mechanism exerts such a biasing force, the resulting counterclockwise motion of the outer rocker arm 238 about the rocker arm joint 234 in an embodiment may cause a corresponding counterclockwise motion of the inner rocker arm 238 about the axis of the rocker arm joint 234. In at least one embodiment, the scissor plate switch contact 218 may be a leaf spring. In further embodiments, the scissor plate switch contact 218 may be anchored at one end or both ends as discussed in various embodiments herein. Such a counterclockwise motion about the axis of the rocker arm joint 234 in an embodiment may cause the portion of the inner rocker arm 236 opposite the rocker arm joint 234 to come into contact with the bottom surface of the scissor plate flange 214 and to rotate the flange 214 clockwise with respect to the rear plate rotation axis 210, or upward and out of its neutral position.

The EPM keyboard control system in an embodiment may determine at block 506 whether the user has selected a preset level of key resistance. When the EPM 226 is activated in an embodiment, it may generate a magnetic field sufficient to pull the flange 214 into its neutral position (e.g. substantially toward the top surface of the EPM 226), causing the portion of the rear scissor plate 206 opposite its axis 210 upward into its neutral position. This upward force supplied to the key cap by the EPM 226 may be adjustable. In some embodiments, such an adjustment may be made based on user input. For example, each individual user may provide user input via a user interface to set the force required to press keys on the keyboard to a level that is tactilely pleasing to the user. If the user has not selected a preset level of key resistance, the method may proceed to block 508. If the user has selected a preset level of key resistance, the method may proceed to block 510. This user selectable EPM magnetic field is an optional embodiment for use with a multi-level EPM.

At block 508, the EPM keyboard control system in an embodiment may set the key switch assembly to a default resistance level. Such a default resistance level may be static and preset (e.g., at the factory), or may be set according to one or more detected external stimuli. For example, the information handling system in an embodiment may detect (e.g., via rotation sensors, hall sensors, proximity sensing elements, gyroscopes, etc.) that the information handling system has been placed in a closed or tablet configuration in which the keyboard is not likely to be used. In such an embodiment, the EPM keyboard control system may set the key switch assembly to stay in a depressed position by turning off the EPM as a default, such that the keys cannot be actuated. In such a way, the EPM keyboard control system may avoid erroneous keystrokes occurring during tablet mode, for example. In yet another embodiment, the EPM keyboard control system may set the key switch assembly upward force based on input received from other applications running on the information handling system to set a default key resistance force level on the keyboard as a whole or on a key-by-key basis. For example, the EPM keyboard control system may receive an indication from a concurrently executed third-person shooter computer game to set the key switch assembly for a given key in a fixed depressed position if actuation of the given key represents an action currently unavailable to the user (e.g., firing of an unavailable weapon).

The EPM keyboard control system in an embodiment may identify one or more EPMs to which current may be applied, and the direction in which such currents may be applied to generate a combined EPM magnetic field sufficient to supply the default or user-selected level of resistive upward force to the key cap at block 510. In some embodiments, only a single EPM for each key may vary between an on and off magnetic field from the EPM. In other embodiments, a multi-level EPM or multiple EPMs may be used to generate several selectable levels of magnetic force for the key assembly. In an embodiment described with reference to FIG. 2, EPM 226 may generate a combined magnetic field that attracts the flange 214 downward. The user must apply a downward force on the key cap 202 sufficient to overcome this magnetic attraction between the flange 214 and the EPM 226, such that the rear scissor plate 206 may rotate about its axis 210, pulling the flange 214 upward and away from the EPM 226. The magnetic attraction between the flange 214 and the EPM 226 in such an embodiment may depend upon the magnitude of the magnetic field generated by the EPM 226. As described herein, in an embodiment employing a single level EPM having a balanced number of high-coercivity magnets and low-coercivity magnets, the single level EPM may be capable of operating in two states. First, the single EPM may be capable of operating in an on state in which the high-coercivity magnetic field combines with the low-coercivity magnetic field. Second, the single level EPM may be capable of operating in an off state in which the high-coercivity magnetic field negates the low-coercivity magnetic field. The EPM keyboard control system in an embodiment may place such a single level EPM in one of these two states based on the direction of a current it applies to one or more electrically conductive wires coiled around the low-coercivity magnet of the single level EPM.

In other aspects, in an embodiment employing a plurality of EPMs within an EPM system, the magnetic fields of each of the plurality of EPMs may be combined in various ways to add or negate magnetic fields to provide various levels of magnetic force in a multi-level, combined EPM magnetic field. Such a multi-level magnetic field may have varying strengths, based on the states in which each of the plurality of EPMs are placed. For example, the EPM keyboard control system in an embodiment may cause the EPM system to generate a low combined EPM magnetic field by enabling fewer of the plurality of EPMs combinations, or to generate a high combined EPM magnetic field by placing more of the plurality of EPMs in a combined on state. As an example, the EPM keyboard control system in an embodiment may cause the EPM system to generate one or more mid-level magnetic fields by placing various combinations of the plurality of EPMs in an on state and placing others in an off state. The EPM keyboard control system in an embodiment may be capable of accessing stored tables in memory that correlate a plurality of combinations of EPMs and current directions with a plurality of resistive upward force values. Such a table may be generated during manufacture of the key switch assembly 200 through testing.

At block 512, the EPM keyboard control system in an embodiment may apply current in the identified direction or directions to the low-coercivity magnet of the identified EPM or multiple low-coercivity magnets identified for a multi-level EPM or EPMs. The low-coercivity magnet or magnets 230 alone or in array with other high-coercivity magnets in such an embodiment may then generate a magnetic field that either combines with or negates the magnetic fields generated by a high-coercivity magnet or magnets of the identified EPM.

The magnetic field generated by the high-coercivity magnet may interact with the magnetic field generated by the low-coercivity magnet of the identified EPM(s) to generate a combined EPM magnetic field that is a default or user-selectable magnetic field at block 514. For example, in an embodiment including an EPM system 226 described with reference to FIG. 2, a plurality of the low-coercivity magnets 230 may be situated nearby one of the high-coercivity magnets 228. If one of the high-coercivity magnets 228 generates a magnetic field having the opposite polarity as the magnetic field generated by a low-coercivity magnet 230 situated nearby, the high-coercivity magnetic field may negate the low-coercivity magnetic field to completely or partially dissipate the combined EPM magnetic field. In contrast, one of the high-coercivity magnets 228 generates a magnetic field having the same polarity as the magnetic field generated by a low-coercivity magnet 230 situated nearby, the high-coercivity magnetic field may combine with the low-coercivity magnetic field to generate a combined EPM magnetic field of a magnitude greater than either the high-coercivity magnetic field or the low-coercivity magnetic field. This will be an on state in some embodiments. Combinations of aligned polarities of low-coercivity magnets with one or more high-coercivity magnets may generate the multiple magnetic levels of a multi-level EPM in yet other embodiments.

At block 516, the combined EPM magnetic field in an embodiment may draw the flange toward one or more magnetically soft shunts 232 propagating the combined magnetic field of the EPM 226, such that the scissor plates tend to rotate toward one another. For example, in an embodiment described with reference to FIG. 2, as the scissor plate EPM flange 214 is drawn downward toward the magnetically soft shunts 232, the rear scissor plate 206 experiences a rotational force causing the portion of the rear scissor plate 206 located farthest from the rear plate rotation axis 210 to tend toward the front scissor plate 208.

The user may apply a force great enough to overcome the attraction between the flange and the EPM in an embodiment at block 518. Upon application of sufficient downward force, the key cap 202 may move downward, and the rotation of the upper portions of scissor plates 206 and 208 away from one another (in the Y-direction) may cause the scissor plate EPM flange 214 to rotate upward such that it no longer contacts the rocker arm 216. This may allow the rocker arm to rotate such that the scissor plate switch contact 218 leaf spring relaxes and one or both ends of the scissor switch plate contact 218 contact the base switch contacts 224. This contact may close a circuit, which the information handling system in an embodiment may register as a keystroke.

As described herein, the key cap moves downward by rotating the portions of the scissor plates located farthest from their respective rotational axes away from one another. Thus, in order to depress the key cap lying atop the scissor plate assembly in an embodiment, the user must supply a force great enough to overcome the rotation force causing the portion of the rear scissor plate 206 located farthest from the rear plate rotation axis 210 to tend toward the front scissor plate 208. This rotational force is inversely related to the magnetic attraction between the flange 214 and the EPM 226, and directly related to the biasing force supplied by a spring (e.g. torsion or leaf spring) or other mechanism in an embodiment. In other words, the magnetic attraction between the flange 214 and the EPM 226 increases the downward force a user must supply to depress the key cap, while the biasing spring force decreases the downward force a user must supply.

Further, the biasing spring force synchronizes contact between the scissor switch plate contact 218 and the base switch contact 224 at or closer to the top of the keystroke than other key assemblies. Upon initial application of downward force (e.g., at the top of the keystroke), the rotation of the scissor plates away from one another, and resulting clockwise rotation of the flange 214 about the rear scissor plate rotation axis 210 may free the inner rocker arm 236 to rotate about the joint 234. As soon as the inner rocker arm 236 is free to rotate, the biasing spring force may pull the scissor plate switch contact 218 toward the base contact 224 to close an electrical circuit, alerting the information handling system a keystroke has occurred.

At block 520, the scissor plate rotation in an embodiment may place the scissor plate assembly in a fully depressed position, where the key cap support plate impedes further downward progress of the key cap. For example, in an embodiment described with reference to FIG. 2, the scissor plates 506 and 508 may rotate away from one another such that a portion of the bottom surface of scissor plates 506 and 508 comes into contact with the cap support plate 222. The electrical contact between the scissor plate switch contact 218 and the base contact 224 described with reference to block 518 in an embodiment may occur at or near the top of the keystroke, when the key cap 202 is only partially depressed from its neutral position, rather than at the bottom of the keystroke where the cap support plate 222 impedes further downward motion of the key cap 202. This may be possible due to the biasing force acting to rotate the rocker arm immediately upon the flange 214 allowing clockwise rotation of the inner rocker arm 236 about the joint 234, which occurs at or near the top of the keystroke.

Figure 6:
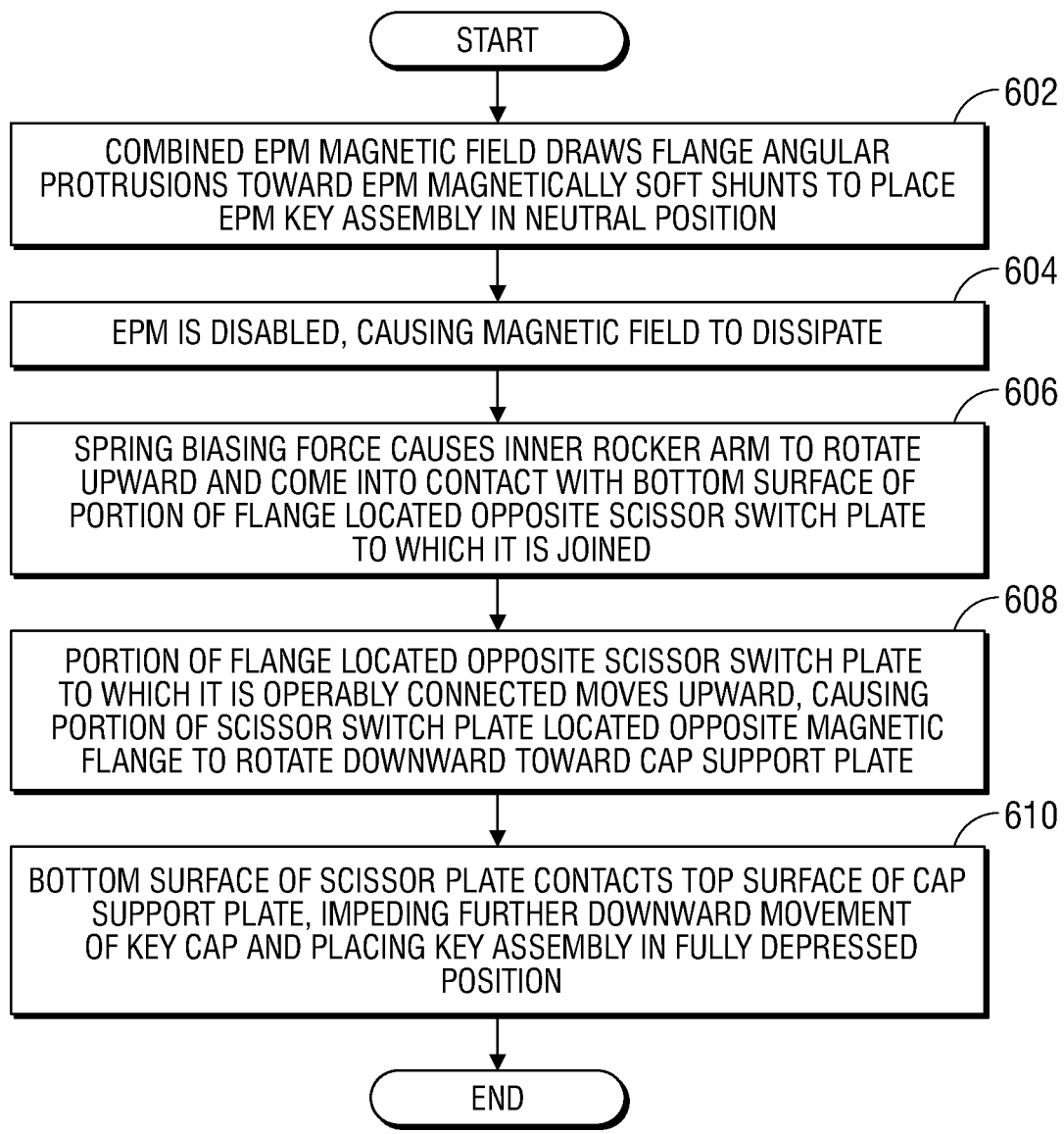
FIG. 6 is a flow diagram illustrating a method of moving a key assembly to a fully depressed position upon disabling of an EPM within the assembly according to an embodiment of the present disclosure.

FIG. 6 is a flow diagram illustrating a method of moving a key assembly to a fully depressed position upon disabling of an EPM within the assembly and overcoming static friction tending to keep the key assembly in the neutral position according to an embodiment of the present disclosure. As described herein, retracting one or more key caps in a depressed position may be useful in guarding against inadvertent keystrokes, such as, when the information handling system has been placed in a tablet configuration, where the user is likely to enter information via a touch screen, rather than via the keyboard, or in a closed configuration when key caps placed in the neutral position may inadvertently rub against the information handling system display.

The EPM in an embodiment may be used to return the key cap to its neutral position. Thus, disabling the EPM in such an embodiment may remove the magnetic force pushing the key cap back to its neutral position. However, if the key cap is already in its neutral position when the EPM is disabled in such a way, the only force acting to pull the key cap down to its depressed position may be gravity. Such a gravitational pull alone may not be great enough to overcome the static friction keeping the scissor plates from rotating about their axes and apart from one another. Further, if the keyboard is turned sideways or upside down, as may occur during transport, the force of gravity may pull the keys toward the display. The spring within the embodiments of the present disclosure may provide a bias, lessening this static friction such that the spring biasing force may cause the key cap to move from the neutral position to the depressed position when the EPM within the key assembly is disabled.

At block 602, a combined EPM magnetic field in an embodiment may draw the flange toward the EPM to place the key assembly in a neutral position. For example, in an embodiment described with reference to FIG. 2, as the scissor plate flange 214 is drawn downward toward the EPM 226, the rear scissor plate 206 experiences a rotational force causing the portion of the rear scissor plate 206 located farthest from the rear plate rotation axis 210 to move toward the front scissor plate 208. This may cause the key cap 202 situated atop the rear and front scissor plates 206 and 208 to raise upward into its neutral position (in the positive Z direction) where the top surface of the key cap 202 lies flush with other key caps within the keyboard.

Once the key cap is placed in its neutral position, a magnetic force and a static friction force may act to keep the key cap in its neutral position. For example, in an embodiment described with reference to FIG. 3, a static friction force may act at the hinge where the rear scissor plate 206 is joined to the base contact assembly to counter any rotation of the rear scissor plate 206 about the rear plate rotation axis 210. Other static friction forces may exist between any two parts that move with respect to one another when the scissor plate assembly 204 moves from its neutral position to its depressed position. Any one of such static friction forces and the magnetic force, or a combination of these forces may act to keep the scissor plate assembly 204 in its neutral position in an embodiment.

The EPM may be disabled in an embodiment at block 604. As described herein, an EPM keyboard control system of the information handling system may control the magnitude of the EPM magnetic field by adjusting the direction of current supplied to one or more low-coercivity magnets within the EPM. In an embodiment, current may be passed in one direction through the coil such that the poles of the magnetic field generated by the low-coercivity magnet 230 are switched to be opposite the poles of the magnetic field generated by the high-coercivity magnet 228. This may cause the high-coercivity magnetic field to cancel out the low-coercivity magnetic field, disabling the EPM 226. Once the EPM 226 is disabled in an embodiment, the static friction force(s) may be the only force tending to keep the scissor plate assembly 204 in the neutral position or gravity may pull the key down fully or partially.

At block 606, a spring biasing force may cause an inner rocker arm to rotate upward and come into contact with the bottom surface of a portion of the flange located opposite the scissor switch plate to which it is joined in an embodiment. For example, in an embodiment described with reference to FIG. 4, a torsional spring within the rocker arm joint 234, or a leaf spring in an embodiment may apply a biasing force causing the inner rocker arm 236 to rotate in a counterclockwise motion about the axis of the rocker arm joint 234. As described herein, the lengths L1 and L2 of the inner rocker arm 236 and outer rocker arm 238, respectively, may be determined in an embodiment such that the force exerted by the inner rocker arm 236 on the bottom surface of the flange 214 is greater than the static friction force tending to keep the key switch assembly in its neutral position when the EPM 226 is deactivated. Thus, the effect of the spring bias force on the inner rocker arm 236 in such an embodiment may be a sufficient bias force on the rocker arm 236 and 238 to overcome any force acting to keep the scissor plate assembly 204 in the neutral position or to return to a neutral position if orientation of the keyboard is changed.

In such an embodiment, the portion of the inner rocker arm 236 opposite the rocker arm joint 234 may move upward (in the positive Z direction) such that its upper surface contacts the bottom surface of the scissor plate flange 214. The flange 214 may be operably connected to the rear scissor plate 206. As the inner rocker arm 236 continues to rotate in such a counterclockwise direction about the rocker arm joint 234, this may cause a corresponding clockwise rotation about the rear plate rotation axis 210 of the portion of the flange 214 operably connected to the rear scissor plate 206.

The portion of the flange located opposite the scissor switch plate to which it is operably connected in an embodiment may move upward at block 608, causing a portion of the scissor switch plate located opposite the flange to rotate downward toward the cap support plate. The flange 214 may be operably connected to the rear scissor plate 206 such that rotation of the scissor plate flange 214 about the rear plate rotation axis 210 causes a corresponding rotation of the rear scissor plate 206 about the axis 210. Thus, the clockwise rotation of the flange 214 about the rear plate rotation axis 210 in an embodiment may cause the rear scissor plate 206 to similarly rotate in a clockwise direction about the axis 210. This may cause the portion of the rear scissor plate 206 located opposite the rear plate rotation axis 210 to rotate clockwise toward the cap support plate 222.

At block 610, the bottom surface of the scissor plate in an embodiment may contact the top surface of the cap support plate, impeding further downward movement of the key cap and placing the key assembly in the fully depressed position. For example, in an embodiment described with reference to FIG. 2, the cap support plate 222 may be fixed to the base contact assembly 220 or to another rigid structure of the keyboard such that it does not move vertically with respect to the base contact assembly 220 and EPM 226 within the base contact assembly 220. Thus, when the rear scissor plate 206 rotates downward until its bottom surface comes into contact with the top surface of the cap support plate 222, the fixed-position cap support plate may inhibit further rotation of the rear scissor plate 206. This may, in turn, obstruct further downward movement (in the negative Z direction) of the key cap 202 situated atop the rear scissor plate 206. In such a way, the biasing force of the spring in an embodiment may overcome the static friction tending to keep the key switch assembly in its neutral position, causing the key cap to move from the neutral position to the depressed position when the EPM within the key assembly is disabled. The key assembly in an embodiment may remain in this position until the EPM 226 is reactivated, causing the flange 214 to rotate downward toward the EPM 226, placing the key assembly back in its neutral position.

The blocks of the flow diagrams of FIGS. 5-6 or steps and aspects of the operation of the embodiments herein and discussed above need not be performed in any given or specified order. It is contemplated that additional blocks, steps, or functions may be added, some blocks, steps or functions may not be performed, blocks, steps, or functions may occur contemporaneously, and blocks, steps or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. An electropermanent magnet key assembly of an information handling system comprising:
    an electropermanent magnet (EPM) having a low-coercivity magnet and a high-coercivity magnet, wherein the EPM is capable of an on state by generating a magnetic field via a first polarity of the low-coercivity magnet and the EPM is capable of an off state by disabling the magnetic field via a second polarity of the low-coercivity magnet, the first and second polarities of the low-coercivity magnet controlled by a direction of current pulse direction applied to an electrically conductive wire coiled around the low-coercivity magnet;
    a key cap, situated atop a pair of scissor plates, capable of downward movement, via action of the pair of scissor plates, from a raised, neutral position in which a surface of the key cap is moved to a depressed position below the neutral position, wherein the downward movement of the key cap may record a keystroke;
    a flange operably coupled to a first scissor plate of the pair of scissor plates and extending opposite of a hinge of the first scissor plate, such that the flange is attracted toward the magnetic field of the EPM in the on state, wherein the magnetic field of the EPM in the on state is situated beneath the pair of scissor plates, to urge the first scissor plate to push the key cap to the neutral position in the on state; and
    a spring exerting a biasing force to rotate a rocker arm toward the flange, where the rocker arm engages the flange for urging the flange away from the EPM opposite to the magnetic field of the EPM in the on state, wherein an effect of the biasing force on movement of the flange is lesser than an attractive force of the magnetic field generated by the EPM on movement of the flange in the on state.

2. The electropermanent magnet key assembly of claim 1, wherein the electropermanent magnetic key assembly is part of an array of electropermanent key assemblies in a keyboard and disabling one or more electropermanent magnetic key assemblies of the array is selectable via instructions from executable code instructions of an electropermanent magnetic keyboard control system.

3. The electropermanent magnet key assembly of claim 1, wherein the biasing force is supplied by a leaf spring operably connected to a base assembly of the key assembly contacting an outer arm of the rocker arm.

4. The electropermanent magnet key assembly of claim 1 further comprising:
    a first switch contact operably connected to the rocker arm and operable to make contact with a switch contact in a base assembly to record the keystroke with the downward movement of the key cap that may record the keystroke when the key cap has only moved downward a portion to the depressed position but is closer to the neutral position than to the depressed position.

5. The electropermanent magnet key assembly of claim 1, wherein the effect of the biasing force urges movement of the key cap from the neutral position to the depressed position when the EPM is in the off state.

6. The electropermanent magnet key assembly of claim 1, wherein a magnitude of the magnetic field generated by the EPM is adjusted by changing a direction of an applied current to a plurality of low-coercivity magnets in various combinations with the high-coercivity magnet.

7. The electropermanent magnet key assembly of claim 1, wherein the high-coercivity magnet is comprised of Neodymium Iron Boron.

8. A method of controlling an electropermanent magnet key assembly of an information handling system comprising:
receiving an instruction to move a key cap situated atop a scissor plate from a neutral position, in which a magnetic force pulls a flange, operably connected to the scissor plate, toward an electropermanent magnet (EPM), to a depressed position and wherein the flange engages a rocker arm; and
applying a current to an electrically conductive wire coiled around a low-coercivity magnet of the EPM to reverse a polarity of the low-coercivity magnet and negate the magnetic force pulling the flange toward the EPM, wherein the magnetic force is generated by a high-coercivity magnet adjacent to the low-coercivity magnet,
wherein a spring-biased force applied by a spring urges the rocker arm to cause rotation of the scissor plate via the flange in an absence of the magnetic force such that the key cap moves to the depressed position limited by a cap support plate.

9. The method of claim 8, wherein the instruction to move the key cap from the neutral position to the depressed position prevents actuation of the electropermanent magnet key assembly and is received in response to detection of a rotation position of the electropermanent magnet key assembly with respect to a digital display of the information handling system.

10. The method of claim 9, wherein the rotation position indicates a closed configuration of the information handling system.

11. The method of claim 9, wherein the rotation position indicates a tablet configuration of the information handling system.

12. The method of claim 9, wherein the instruction to move the key cap from the neutral position to the depressed position is sent to an array of a plurality of electropermanent magnet key assemblies of a keyboard to retract keys of the keyboard.

13. The method of claim 8, wherein an effect of the spring-biased force on movement of the key cap is greater than gravity on the key cap to return to the neutral position if the key assembly is turned upside down.

14. The method of claim 8, wherein an effect of the magnetic force on movement of the flange is greater than an effect of the spring-biased force on movement of the flange when the EPM is enabled to generate a magnetic force.

15. An electropermanent magnet key assembly of an information handling system comprising:
an electropermanent magnet (EPM) having a low-coercivity magnet and a high-coercivity magnet, wherein the EPM is capable of an on state by generating a magnetic field via a first polarity of the low-coercivity magnet set with a current applied in a first current pulse direction to an electrically conductive wire coiled around the low-coercivity magnet and the EPM is capable of an off state by disabling the magnetic field via a second polarity of the low-coercivity magnet set with a current applied in a second current pulse direction to the electrically conductive wire coiled around the low-coercivity magnet;
a key cap, situated atop a pair of scissor plates, capable of downward movement, via action of the pair of scissor plates, from a raised, neutral position in which a surface of the key cap is moved to a depressed position below the neutral position where the depressed position is limited by a key cap support plate;
a flange operably coupled to a first scissor plate of the pair of scissor plates and extending opposite of a hinge of the first scissor plate, such that the flange is attracted toward the magnetic field of the EPM in the on state, wherein the magnetic field of the EPM in the on state is situated beneath the pair of scissor plates, to urge the first scissor plate to raise the key cap to the neutral position;
a leaf spring exerting a biasing force to rotate a rocker arm toward the flange, where the rocker arm engages the flange for urging the flange away from the EPM opposite to an attractive force of the magnetic field when the EPM is in the on state; and
a switch contact closed by relaxing the leaf spring toward the EPM to record a keystroke.

16. The electropermanent magnet key assembly of claim 15, further comprising:
the leaf spring coming into electrically conductive contact with the switch contact upon application of a downward force to the key cap such that an information handling system registers an occurrence of the keystroke with the downward movement of the key cap that may record the keystroke when the key cap has only moved downward a portion to the depressed position but is closer to the neutral position than to the depressed position, wherein the switch contact is operably connected to a base assembly.

17. The electropermanent magnet key assembly of claim 15, wherein an effect of the biasing force on movement of the flange is lesser than the attractive force of the magnetic field when the EPM is in the on state.

18. The electropermanent magnet key assembly of claim 15, wherein the EPM is a multi-level EPM with an array of low-coercivity magnets for which magnetic force is adjustable based on selection of current pulses to reverse polarity of one or more low-coercivity magnets of the array of low-coercivity magnets.

19. The electropermanent magnet key assembly of claim 18 further comprising: a selection of magnetic force is available via an electropermanent magnetic keyboard control system for selection of key assembly force resistance levels by a user.

20. The electropermanent magnet key assembly of claim 15, wherein the electropermanent magnetic key assembly is part of an array of electropermanent key assemblies in a keyboard and disabling one or more electropermanent magnetic key assemblies of the array is selectable via instructions from an electropermanent magnetic keyboard control system.

* * * * *